United States Patent
Herrera

(10) Patent No.: US 8,692,615 B2
(45) Date of Patent: Apr. 8, 2014

(54) ENHANCED TRANSCONDUCTANCE CIRCUIT

(75) Inventor: Sandro Herrera, Medford, MA (US)

(73) Assignee: Analog Devices, Inc., Norwood, MA (US)

( * ) Notice: Subject to any disclaimer, the term of this patent is extended or adjusted under 35 U.S.C. 154(b) by 88 days.

(21) Appl. No.: 13/424,961

(22) Filed: Mar. 20, 2012

(65) Prior Publication Data
US 2013/0249632 A1    Sep. 26, 2013

(51) Int. Cl.
*H03F 3/45* (2006.01)
(52) U.S. Cl.
USPC .......... 330/252; 330/124 R; 330/295
(58) Field of Classification Search
USPC .............. 330/252–261, 124 R, 295
See application file for complete search history.

(56) References Cited

U.S. PATENT DOCUMENTS

| | | |
|---|---|---|
| 4,599,572 A | 7/1986 | Nakayama |
| 5,903,185 A | 5/1999 | Cargill |
| 6,963,244 B1 | 11/2005 | Carter |
| 7,358,777 B2 * | 4/2008 | Lehto ............ 327/52 |
| 2010/0060359 A1 | 3/2010 | Herrera et al. |
| 2010/0097141 A1 | 4/2010 | Herrera |

OTHER PUBLICATIONS

Analog Devices, Inc., "Low Power, Unity Gain, Fully Differential Amplifier and ADC Driver," AD8476 Data Sheet, Rev. A, Nov. 2011.
International Search Report and Written Opinion of the International Searching Authority in counterpart international application No. PCT/US2013/032752, report dated Jun. 4, 2013 (8 pages).

* cited by examiner

*Primary Examiner* — Hieu Nguyen
(74) *Attorney, Agent, or Firm* — Kenyon & Kenyon LLP

(57) ABSTRACT

A transconductance circuit that improves linearity and output current over a wider range of input voltages than prior designs. The transconductance circuit may include first and second sets of paired differential transistors. In each set, emitters of the paired transistors may be commonly coupled to corresponding nodes of a common impedance, and collectors may be coupled to output terminals of the transconductance circuit. The circuit may further include first and second sets of doublet differential transistor pairs, each doublet pair having transistors of different sizes. Each doublet pair may have current sources coupled between commonly coupled emitters and a source potential. Respective collectors for each doublet pair may be coupled to the output terminals of the transconductance circuit. A pair of voltage followers may be provided to replicate corresponding input voltages across corresponding bases of the differential transistor pairs and the doublet transistor pairs.

7 Claims, 10 Drawing Sheets

200

300

400

500

600

700

800

1000

ENHANCED TRANSCONDUCTANCE CIRCUIT

BACKGROUND

Transconductance is a property of certain electronic circuits which relates to a ratio of a change in the output current generated by a circuit versus the change in input voltage supplied to the circuit. Transconductance may be referred to herein as "$G_M$," and can be represented mathematically as:

$$G_M = \frac{\Delta I_{OUT}}{\Delta V_{IN}} \qquad \text{Eqn. 1}$$

A transconductance circuit may be referred to as a "$G_M$ circuit." Ideally, the transconductance of a $G_M$ circuit should remain linear with corresponding input voltage changes. Further, the output current of a $G_M$ circuit should track corresponding input voltage changes.

In application, however, linear transconductance and output current tracking is difficult to achieve. A $G_M$ circuit is often implemented using a differential pair of transistors as shown in the differential pair transconductance circuit 100 of FIG. 1, but this type of circuit suffers from known disadvantages.

The differential pair circuit 100 includes a pair of transistors Q1, Q2 having common emitter couplings. A current source $I_{SOURCE}$ is coupled to the common emitters of Q1, Q2 to bias the circuit. Output currents $I_{OUTP}$, $I_{OUTM}$ are obtained from collectors of Q1 and Q2. A differential input signal $V_{IN}$, is represented by the difference of voltages $V_{INP}$, $V_{INM}$, which are applied to the corresponding bases of Q1 and Q2. The circuit 100 generates a differential output current $I_{OUT}$ represented by the difference of output currents $I_{OUTP}$, $I_{OUTM}$.

As the input voltages $V_{INP}$, $V_{INM}$ vary, the differential pair generates corresponding output currents $I_{OUTP}$, $I_{OUTM}$, which relate to the input voltages. FIG. 2 is a graph 200 illustrating a simulated transconductance and differential output current $I_{OUT}$ for the differential pair circuit 100 of FIG. 1. The simulated transconductance and differential output current $I_{OUT}$ are normalized for illustrative purposes.

As shown in FIG. 2, as a differential input voltage $V_{IN}$ is applied across the bases of Q1 and Q2 from −160 mV to 160 mV, transconductance ($G_M$) of the circuit 100 is linear only for a small range of differential input voltages near 0V. As the differential input voltage $V_{IN}$, varies away from 0V, the transconductance varies in a non-linear manner.

Further, the output current $I_{OUT}$ does not track changes of the differential input voltage $V_{IN}$. Rather, $I_{OUT}$ only tracks changes in the differential input voltage $V_{IN}$ from approximately −20 mV to 20 mV, and then begins to saturate. The output current for the differential pair circuit 100 is limited by the output current from the current source $I_{SOURCE}$.

The differential pair circuit 100 generates an undesirable output error for input voltages $V_{INP}$, $V_{INM}$ that are supplied at common mode voltage levels. The error is a consequence of the finite output impedance for the current source $I_{SOURCE}$. The output error exhibits rectification which also degrades the transconductance linearity for the differential pair circuit 100.

FIG. 3 illustrates a doublet transconductance circuit 300 (referred to as a "doublet circuit" herein). The doublet circuit 300 includes complementary sets of area-offset differential transistor pairs. A first set includes transistors, $QU_{1.1}$, $QU_{1.2}$ having a current source $I_{U.1}$ coupled between emitters of each transistor and a first source potential VSS. A complementary transistor pair $QL_{1.1}$, $QL_{1.2}$ have a current source $I_{L.1}$ coupled between emitters of each transistor and a second source potential VDD. A second set includes transistors $QU_{2.1}$, $QU_{2.2}$ having a current source $I_{U.2}$ coupled between emitters of each transistor and the first source potential VSS. A complementary transistor pair $QL_{2.1}$, $QL_{2.2}$ have a current source $I_{L.2}$ coupled between emitters of each transistor and the second source potential VDD.

A first input voltage $V_{INP}$ is applied to the bases of transistors $QU_{1.1}$, $QU_{2.1}$, $QL_{1.1}$, and $QL_{2.1}$. A second input voltage $V_{INM}$ is applied to the bases of transistors $QU_{1.2}$, $QU_{2.2}$, $QL_{1.2}$, and $QL_{2.2}$. Output currents $I_{OUTP.1}$ and $I_{OUTM.1}$ are obtained from the collectors of $QU_{1.1}$-$QU_{2.2}$ and represent half of an overall output current $I_{OUT1}$ for the doublet circuit 300. Output currents $I_{OUTP.2}$ and $I_{OUTM.2}$ are obtained from the collectors of $QL_{1.1}$-$QL_{2.2}$ and represent half of an overall output current $I_{OUT2}$ for the doublet circuit 300.

The transistors $QU_{1.1}$-$QU_{2.2}$ and $QL_{1.1}$-$QL_{2.2}$ have area offsets as represented by $A_{OFF}$:1 where $A_{OFF}$ corresponds to an offset area factor among the transistors. Transistors $QU_{1.2}$, $QU_{2.1}$, $QL_{1.2}$, and $QL_{2.1}$ are larger than the other transistors by the offset factor $A_{OFF}$. When activated, the area offset transistors conduct a correspondingly higher current than the smaller transistors.

FIG. 4 is a graph 400 simulating transconductance for the doublet circuit of FIG. 3 for various area offset factors. As illustrated in FIG. 4, the transconductance for the doublet circuit is flattened or "spread" for various area offset factors including $A_{OFF}$=4 and $A_{OFF}$=6. For an area offset factor of $A_{OFF}$=1, the transconductance is similar to that of the differential pair circuit 100 of FIG. 1. As the area offset is increased to $A_{OFF}$=4, the transconductance linearity is improved for differential input voltages $V_{IN}$ from approximately −20 mV to 20 mV. As the area offset is increased to $A_{OFF}$=6, transconductance continues to spread but linearity is degraded.

Although the doublet circuit 300 provides improvements for transconductance linearity, the output current is limited similar to that of the differential pair circuit 100. The output current of the doublet circuit 300 is limited by the currents from the current sources $I_{U.1}$, $I_{U.2}$, $I_{L.1}$, and $I_{L.2}$.

Accordingly, there is a need in the art for a transconductance circuit that improves transconductance linearity and output current.

DETAILED DESCRIPTION

Embodiments of the present invention provide a transconductance circuit that improves transconductance linearity and output current over a wider range of input voltages than prior designs. The transconductance circuit may include first and second sets of paired differential transistors, where, in each set, emitters of the paired transistors may be commonly coupled to corresponding nodes of a common impedance, and collectors may be coupled to output terminals of the transconductance circuit. The circuit may further include first and second sets of doublet differential transistor pairs, each doublet pair having transistors of different sizes. Each doublet transistor pair may have current sources coupled between commonly coupled emitters and a source potential. Respective collectors for each doublet transistor pair may be coupled to the output terminals of the transconductance circuit. A pair of voltage followers may be provided to replicate corresponding input voltages across corresponding bases of the complementary set of differential transistor pairs and the complementary sets of doublet transistor pairs.

As noted, the transconductance of a single differential pair is non-linear over a wide range of input voltages and the doublet circuit, while providing improvements for transconductance linearity, has limited output current. In the configuration of the embodiments described herein, non-linear behavior is mitigated in large part because non-linearities in the sets of differential transistor pairs are counter-acted by non-linearities in the sets of doublet transistor pairs. This phenomenon is discussed in greater detail herein below. Output current is also improved in the configuration of the embodiments described herein.

Figure 5:
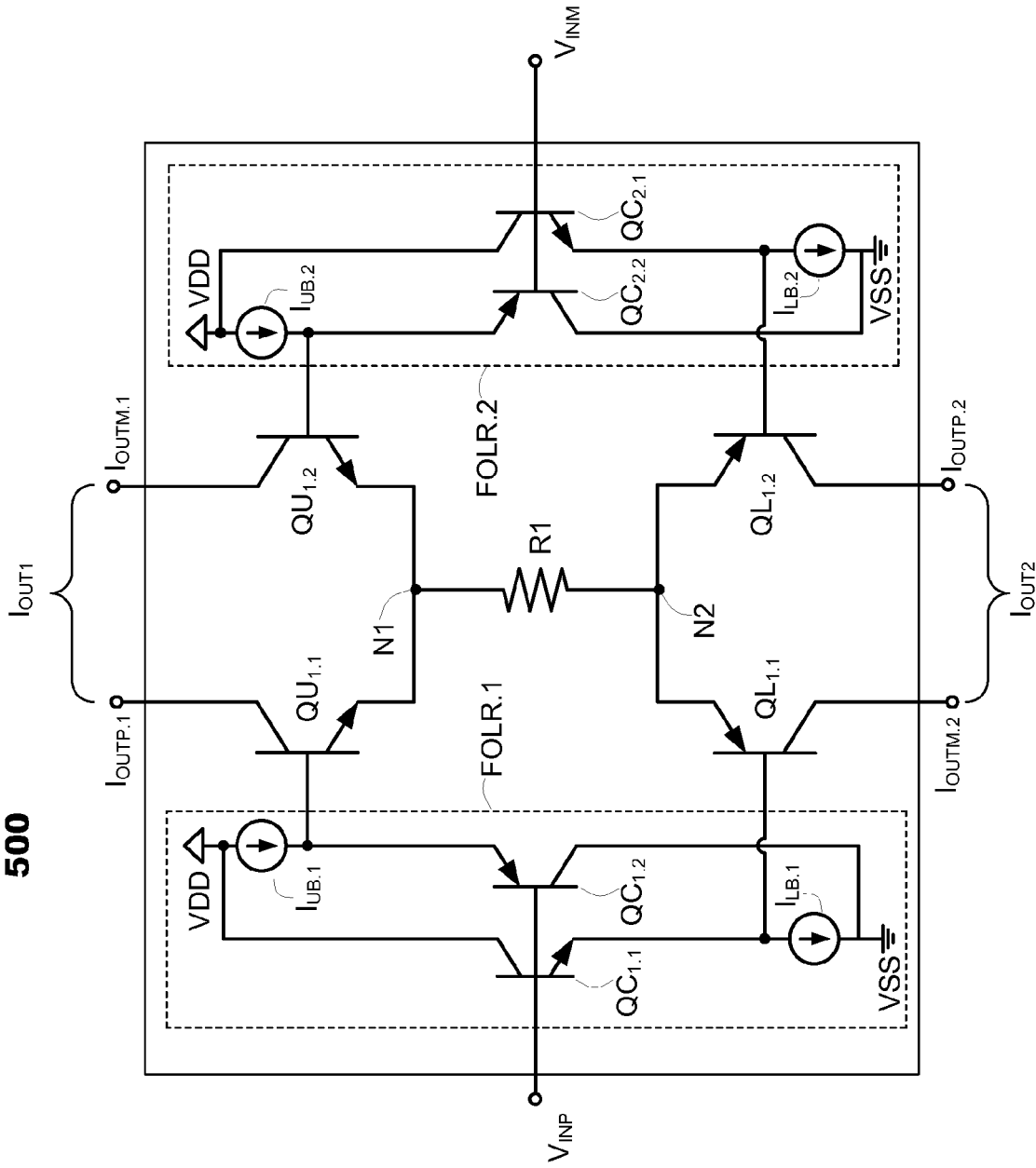
FIG. 5 illustrates a transconductance circuit according to an embodiment of the present invention.

FIG. 5 illustrates a transconductance circuit 500 according to an embodiment of the present invention (referred to as an "I-bridge circuit" herein). The I-bridge circuit 500 may include complementary sets of differential transistor pairs. A first differential pair may include a first pair of transistors $QU_{1.1}$, $QU_{1.2}$, having emitters commonly coupled to a first node N1, and collectors coupled to corresponding output terminals $I_{OUTP.1}$, $I_{OUTM.1}$. A second differential pair may include a second pair of transistors $QL_{1.1}$, $QL_{1.2}$, having emitters commonly coupled to a second node N2, and collectors coupled to corresponding output terminals $I_{OUTM.2}$, $I_{OUTP.2}$. A common impedance R1 may be coupled between the first and second node N1, N2.

A pair of voltage followers FOLR.1, FOLR.2 may be coupled to bases of corresponding transistors $QU_{1.1}$, $QL_{1.1}$ and $QU_{1.2}$, $QL_{1.2}$. The voltage followers FOLR.1, FOLR.2 may replicate input voltages $V_{INP}$, $V_{INM}$ at bases of the corresponding transistors. A first follower FOLR.1 may include a complementary pair of transistors $QC_{1.1}$, $QC_{1.2}$. Current sources $I_{UB.1}$, $I_{LB.1}$ may be coupled respectively to transistors $QU_{1.1}$ and $QL_{1.1}$. The first follower FOLR.1 may receive a first input voltage $V_{INP}$ and replicate corresponding voltages at bases of the transistors $QU_{1.1}$, and $QL_{1.1}$. A second follower FOLR.2 may include a complementary pair of transistors $QC_{2.1}$, $QC_{2.2}$. Current sources $I_{UB.2}$, $I_{LB.2}$ may be coupled to respective bases for transistors $QU_{1.2}$, $QL_{1.2}$. The second voltage follower FOLR.2 may receive a second input voltage $V_{INM}$ and replicate corresponding voltages at bases of the transistors $QU_{1.2}$ and $QL_{1.2}$.

Currents generated at outputs $I_{OUTP.1}$ and $I_{OUTM.1}$ each may represent one-half of an overall output current $I_{OUT1}$ for the I-bridge circuit 500. Similarly, currents generated at outputs $I_{OUTP.2}$ and $I_{OUTM.2}$ each may represent one-half of an overall output current $I_{OUT2}$ for the I-bridge circuit 500.

During operation, each follower FOLR.1, FOLR.2 may replicate corresponding voltages for driving the bases of each set of paired transistors from input voltage $V_{INP}$, $V_{INM}$. As the input voltages $V_{INP}$, $V_{INM}$ may vary, each of the first pair of transistors $QU_{1.1}$, $QU_{1.2}$ may generate corresponding output currents $I_{OUTP.1}$, $I_{OUTM.1}$, which may relate to input voltage variations. Similarly, each of the second pair of transistors $QL_{1.1}$, $QL_{1.2}$ may generate corresponding output currents $I_{OUTP.2}$, and $I_{OUTM.2}$ which may relate to the input voltage variations.

Figure 1:
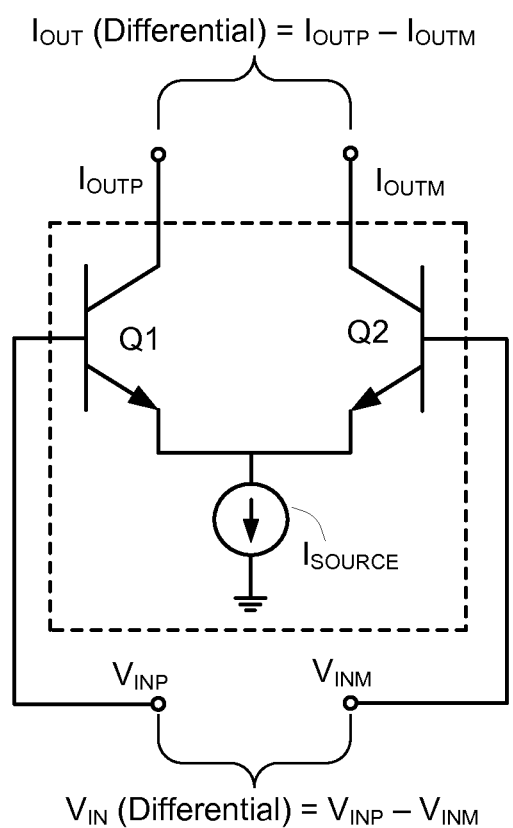
FIG. 1 illustrates a differential pair transconductance circuit.
Figure 2:
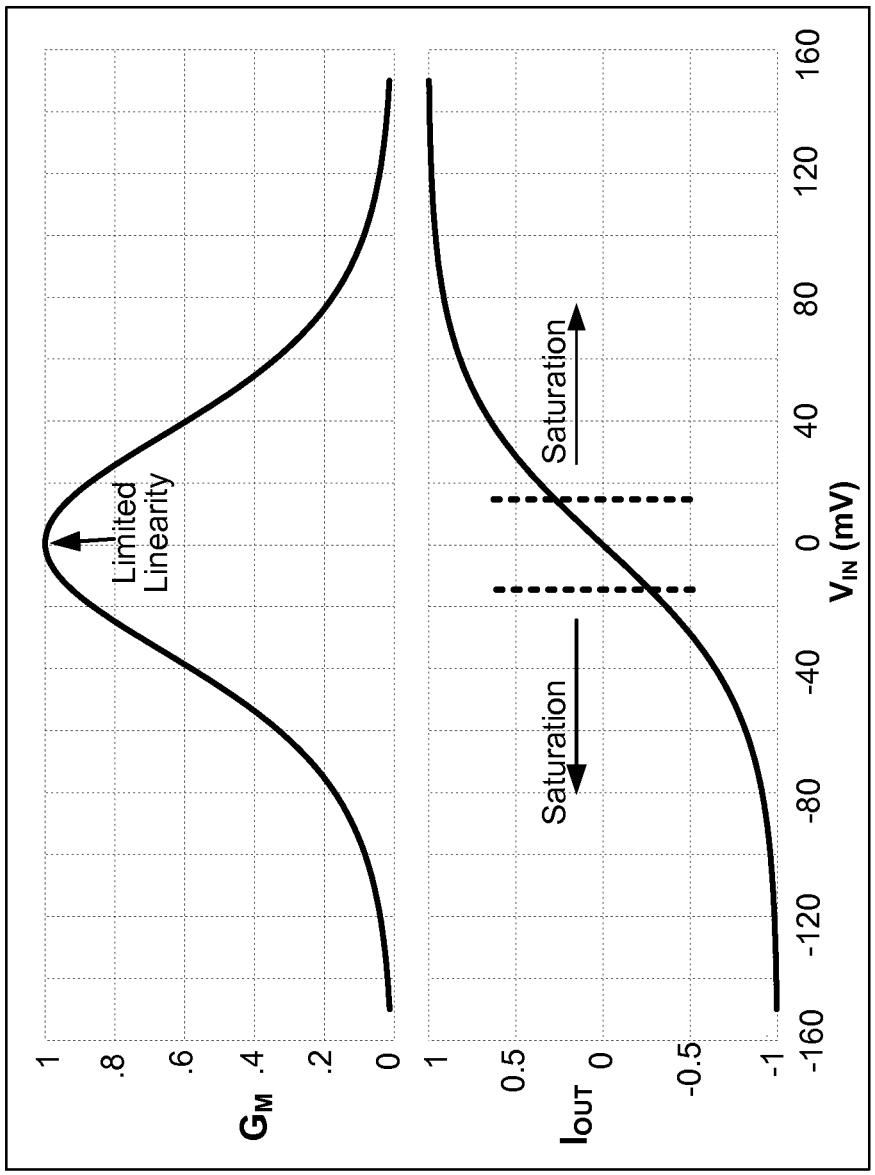
FIG. 2 is a graph simulating transconductance and differential output current for the differential pair circuit of FIG. 1.
Figure 3:
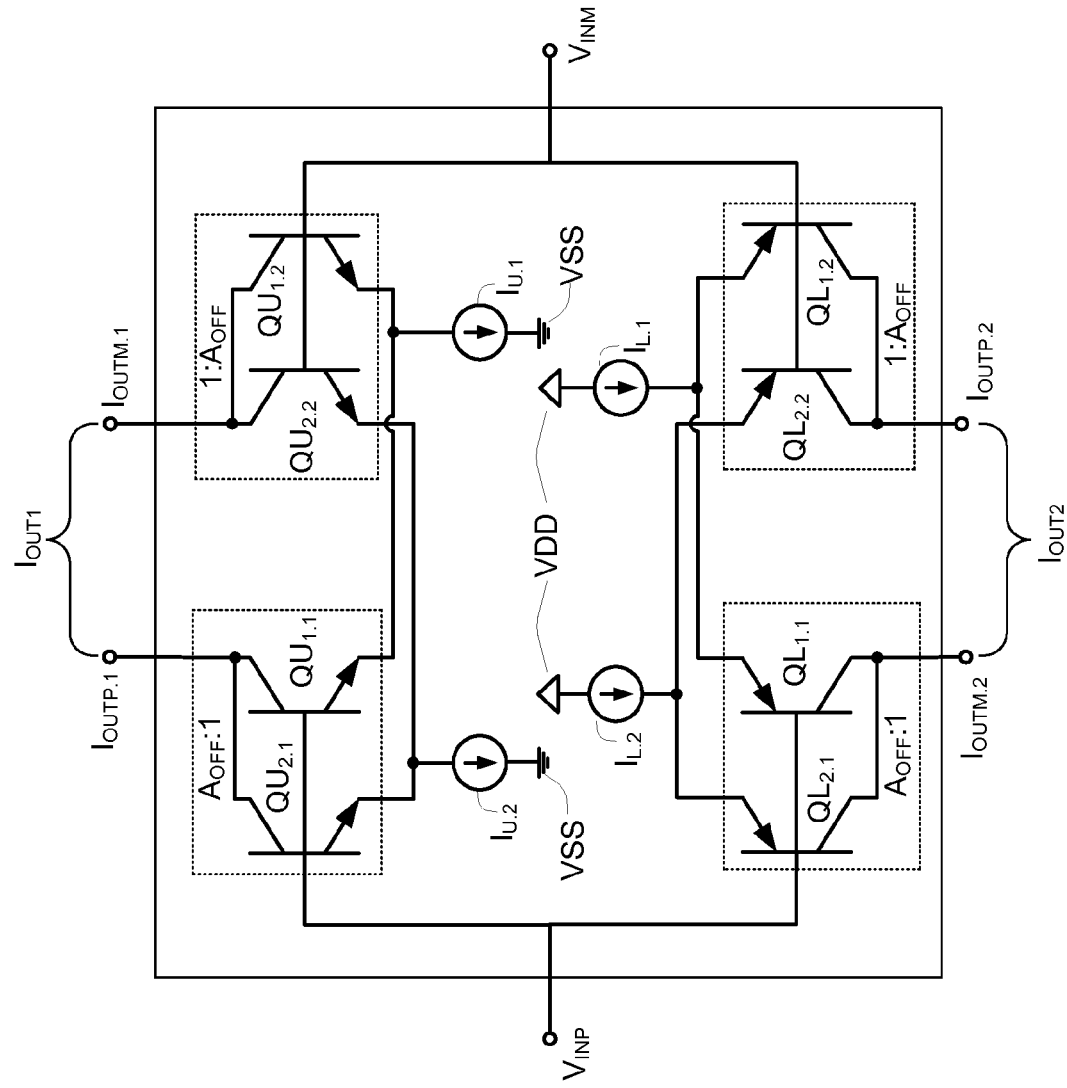
FIG. 3 illustrates a doublet transconductance circuit.
Figure 4:
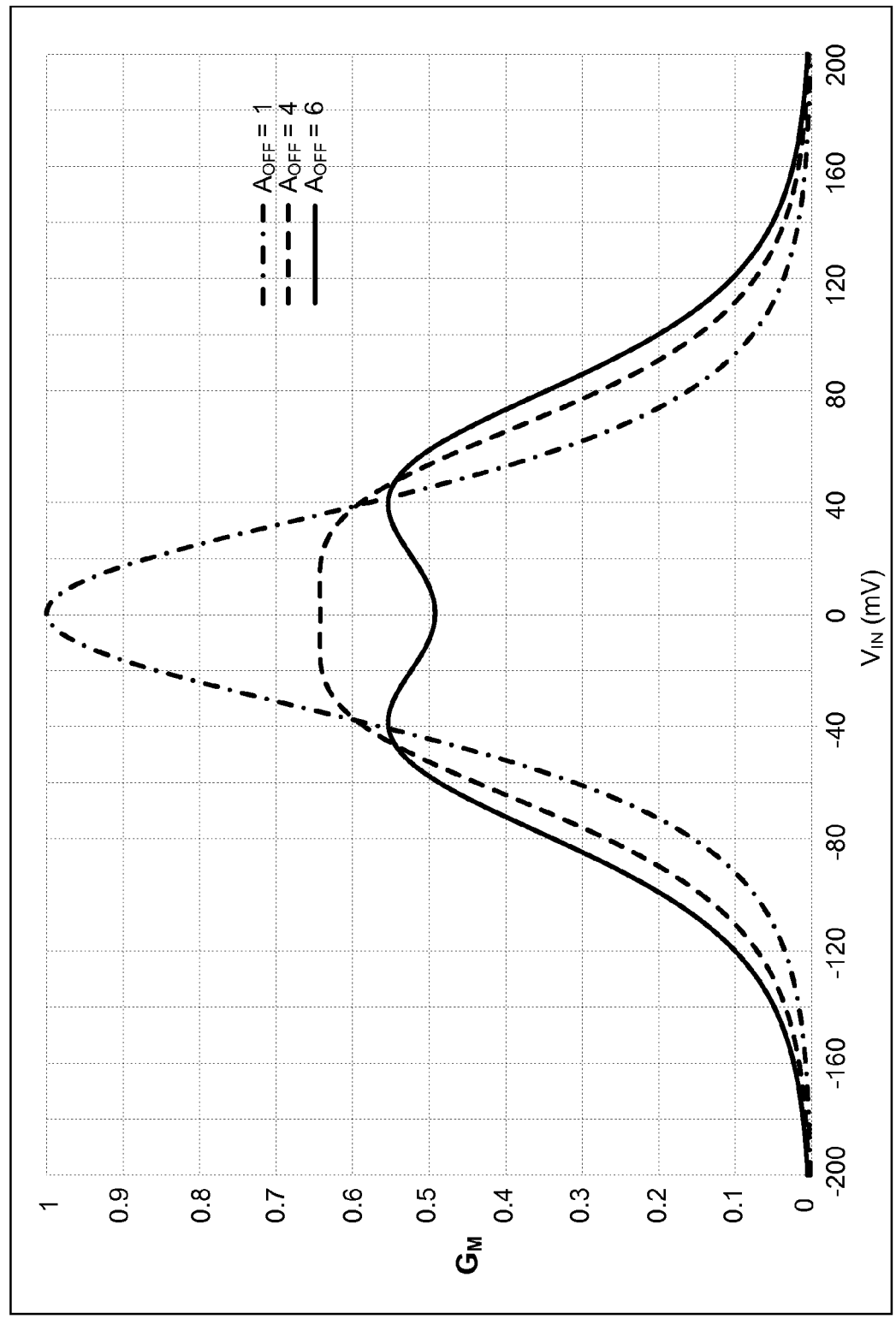
FIG. 4 is a graph simulating transconductance for the doublet circuit of FIG. 3 for various area offset factors.
Figure 6:
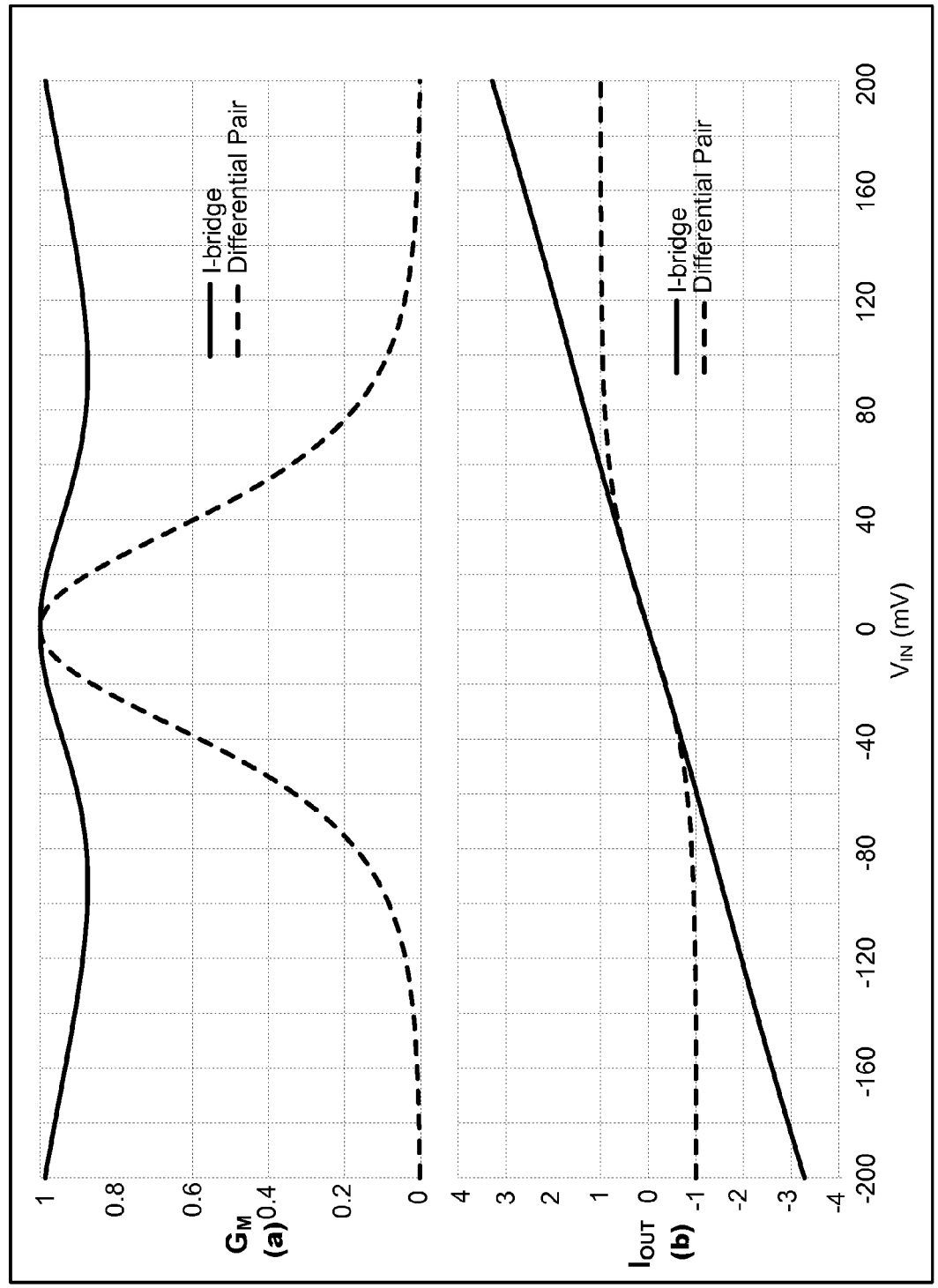
FIG. 6 is a graph simulating transconductance and differential output current for the transconductance circuit of FIG. 5 versus that of the differential pair circuit of FIG. 1.

The I-bridge circuit 500 improves transconductance linearity and output current over the differential pair of FIG. 1. FIG. 6 is a graph 600 simulating a transconductance and differential output current response $I_{OUT}$ for the I-bridge circuit 500 of FIG. 5 versus that of the differential pair of FIG. 1. FIG. 6(a) compares the transconductance linearity for both circuits for a range of differential input voltages $V_{IN}$ from −200 mV to 200 mV. FIG. 6(b) compares the differential output current response $I_{OUT}$ for both circuits across the voltage range. The output of each circuit type is normalized for comparative purposes.

As illustrated, transconductance linearity of the I-bridge circuit 500 is improved over that of the differential pair circuit 100 of FIG. 1. Coupling the resistor R1 between the first and second pairs of transistors may flatten the overall transconductance for the I-bridge circuit 500 (solid line). In contrast, the overall transconductance for differential pair circuit 100 (dashed line) varies greatly over the range of input voltages $V_{IN}$.

The output current $I_{OUT}$ of the I-bridge circuit 500 is improved over that of the differential pair circuit. As illustrated, the output current of the I-bridge circuit 500 may track changes for differential input voltages $V_{IN}$ from approximately −200 mV to 200 mV without saturation. The output current of the I-bridge circuit 500 should not saturate because the first and second transistor pairs are not limited by the output current of a current source. In contrast, the output current of the differential pair circuit 100 is limited by the output current of current source $I_{SOURCE}$ and therefore begins to saturate as the differential input voltages $V_{IN}$ begin to diverge from 0 mV. In various embodiments, the output current for the I-bridge circuit 500 may be configured to track predetermined ranges of differential input voltages $V_{IN}$ by changing the value of the common impedance R1.

The I-bridge circuit 500 may also reduce output error current over the differential pair circuit of FIG. 1 for common mode input voltages. The complementary configuration of the first and second transistor pairs $QU_{1.1}$, $QU_{1.2}$, $QL_{1.1}$, and $QL_{1.2}$ and complementary current sources $I_{UB.1}$, $I_{UB.2}$, and $I_{LB.1}$, $I_{LB.2}$ may minimize the output error current. Although each transistor of the first and second transistor pairs individually may develop output error currents for common mode input voltages, the complementary configuration of each pair in the I-bridge circuit 500 may cause the respective error currents from each pair to effectively cancel each other out. Thus, the overall output error current of the I-bridge circuit 500 may be minimized for common mode voltages.

Noise levels for the I-bridge circuit 500 may also be minimized even with the addition of the impedance R1 coupled between the upper and lower transistor pairs. Typically, adding resistances into a transconductance circuit increases differential noise for the circuit. However, by coupling the impedance R1 between the upper and lower transistor pairs, noise that may be generated across the impedance R1 may be common mode noise shared by each of the first and second sets of paired transistors. Thus, no noise should be contributed by the impedance R1.

Figure 7:
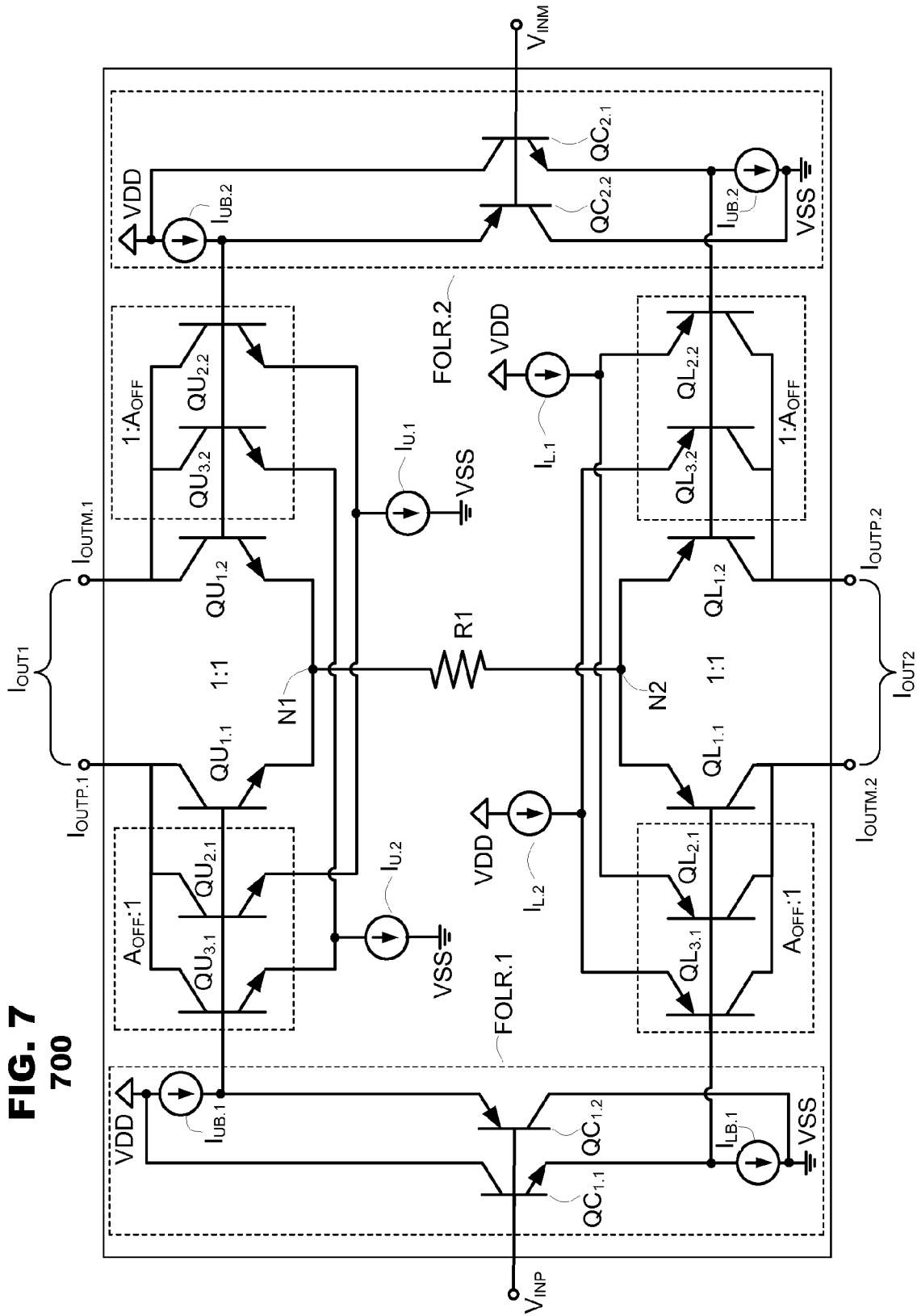
FIG. 7 illustrates an enhanced transconductance circuit according to an embodiment of the present invention.

FIG. 7 illustrates an enhanced transconductance circuit 700, according to an embodiment of the present invention that combines the I-bridge circuit and the doublet circuit. By combining the I-bridge circuit and the doublet circuit, this embodiment improves transconductance linearity even further.

The enhanced transconductance circuit 700 of this embodiment may include two sets of differential transistor pairs $QU_{1.1}, QU_{1.2}$ and $QL_{1.1}, QL_{1.2}$, an impedance R1, and voltage followers FOLR.1, FOLR.2 of an I-bridge circuit. The circuit 700 also may include two sets of area offset differential transistor pairs $QU_{2.1}, QU_{3.1}$ and $QU_{2.2}, QU_{3.2}$; $QL_{2.1}, QL_{3.1}$ and $QL_{2.2}, QL_{3.2}$ of a doublet circuit. As illustrated, bases of the doublet transistors $QU_{2.1}, QU_{3.1}, QL_{2.1}$, and $QL_{3.1}$ may be coupled to outputs of the voltage follower FOLR.1. Similarly, bases of the doublet transistors $QU_{2.2}, QU_{3.2}, QL_{2.2}$, and $QL_{3.2}$ may be coupled to outputs of the voltage follower FOLR.2.

The doublet circuit may include current sources $I_{U.1}, I_{U.2}, I_{L.1}, I_{L.2}$ coupled between corresponding sets of doublet transistor emitters and source potentials VDD and VSS. The enhanced transconductance circuit 700 may have output terminals $I_{OUTP.1}, I_{OUTM.1}, I_{OUTP.2}$, and $I_{OUTM.2}$ coupled to collectors of transistors of each of the combined I-bridge circuit and the doublet circuit.

Figure 8:
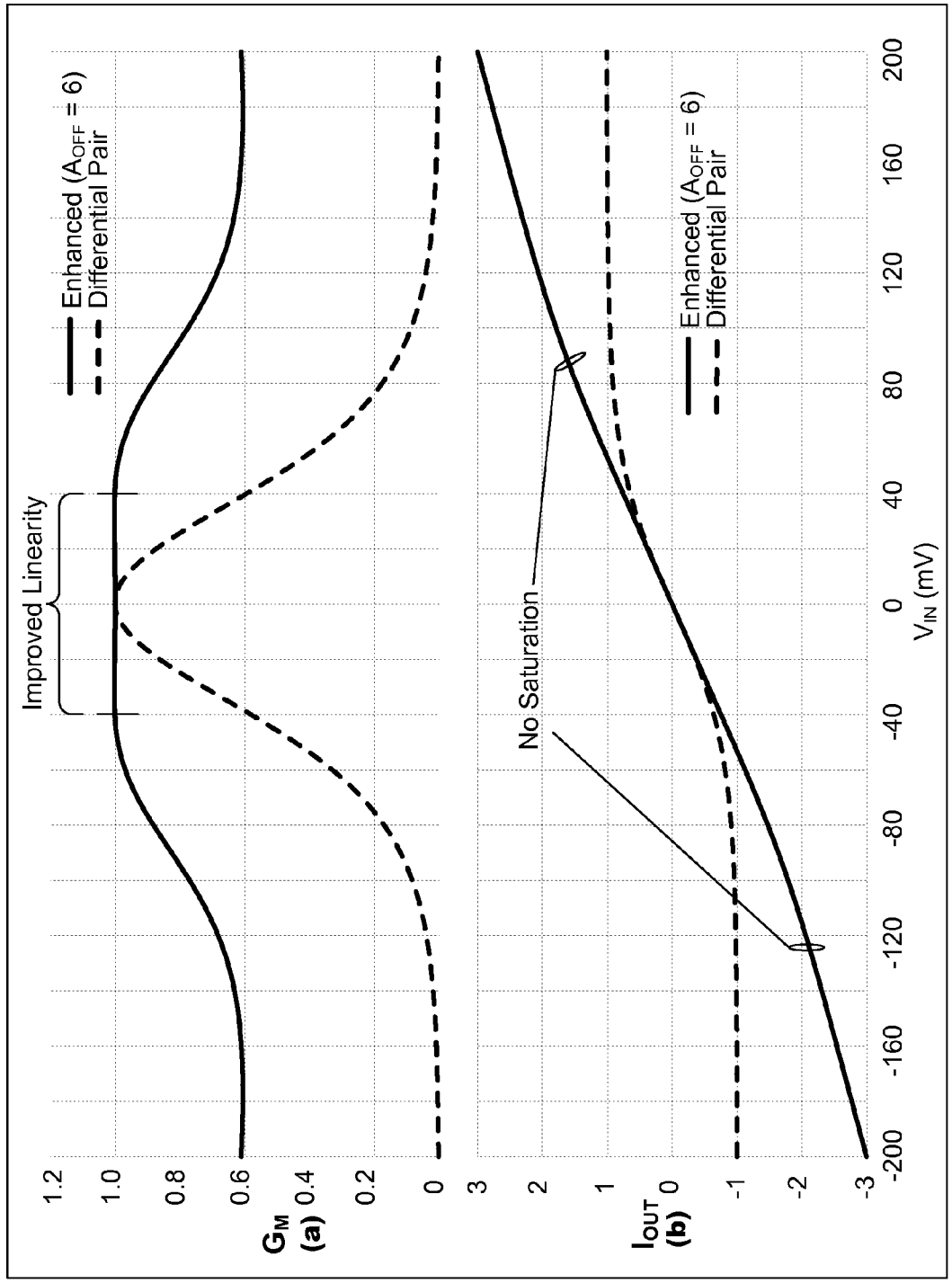
FIG. 8 is a graph simulating transconductance and differential output current for the enhanced transconductance circuit of FIG. 7 versus that of the differential pair circuit of FIG. 1.

During operation, the enhanced transconductance circuit 700 improves linearity by combining the transconductance of the I-bridge circuit and doublet circuit. FIG. 8 is a graph 800 simulating a transconductance and differential output current $I_{OUT}$ for the enhanced transconductance circuit 700 having an area offset factor $A_{OFF}=6$ versus the differential pair circuit 100 of FIG. 1. The output of each circuit type is normalized for comparative purposes. As illustrated in FIG. 8(a), the simulated transconductance linearity for the enhanced transconductance circuit 700 is improved over that of the differential pair circuit 100 over a range of differential input voltages $V_{IN}$ from approximately −50 mV to 50 mV.

The enhanced transconductance circuit 700 improves differential output current $I_{OUT}$ over that of the differential pair circuit 100. As illustrated in FIG. 8(b), the enhanced transconductance circuit 700 may generate an output current $I_{OUT}$ that tracks changes for the differential input voltage $V_{IN}$ without saturation. For example, the output current of the enhanced transconductance circuit 700 may track changes for differential input voltages $V_{IN}$ from approximately −200 mV to 200 mV without saturation. In contrast, the output current of the differential pair circuit 100, which is limited by the output current of the current source $I_{SOURCE}$, begins to saturate as the differential input voltages $V_{IN}$ begin to diverge from 0 mV.

The enhanced transconductance circuit 700 also minimizes output error currents for common mode input voltages. In various embodiments, the output current may be configured to correspond to various ranges of differential input voltages $V_{IN}$ by changing the value of the common impedance R1. In various embodiments, the area offset factor $A_{OFF}$ may be configured to adjust the transconductance linearity for the enhanced transconductance circuit 700 for predetermined ranges of differential input voltages $V_{IN}$.

Figure 9:
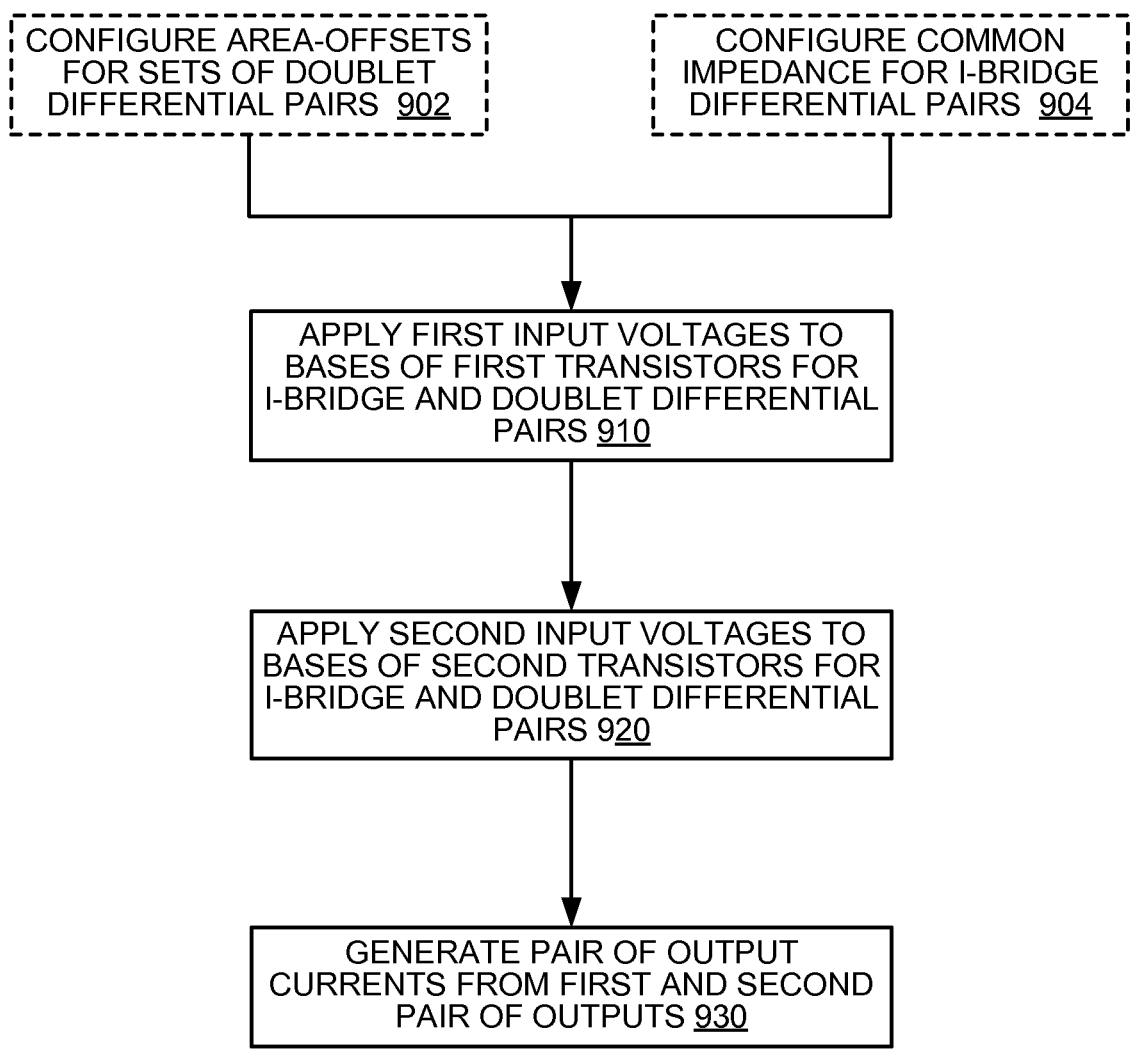
FIG. 9 is a method for generating a pair of output currents from a transconductance circuit which track voltage changes for a first predetermined range of input voltages according to an embodiment of the present invention.

FIG. 9 is a method 900 for generating a pair of output currents from a transconductance circuit which track voltage changes for a predetermined range of input voltages according to an embodiment of the present invention. As illustrated in block 910, the method 900 may apply one of a pair of input voltages across bases of a corresponding set of complementary I-bridge differential transistor pairs and corresponding sets of complementary doublet differential transistor pairs. The method 900 may apply the other of the pair of input voltages across opposite bases of the corresponding set complementary I-bridge differential transistor pairs and the corresponding sets of complementary doublet differential transistor pairs (block 920). The method 900 may generate the pair of output currents from a first and second pair of outputs of the transconductance circuit, wherein each output of each pair may represent one-half of one of the pair of output currents for the transconductance circuit (block 930).

In an embodiment, the method 900 may configure area offsets for the complementary sets of doublet differential transistor pairs to generate an approximately linear transconductance across the predetermined range of input voltages (block 902). In an embodiment, the method may configure a common impedance value for the I-bridge differential transistor pairs to generate the output current for the predetermined range of input voltages (block 904).

Figure 10:
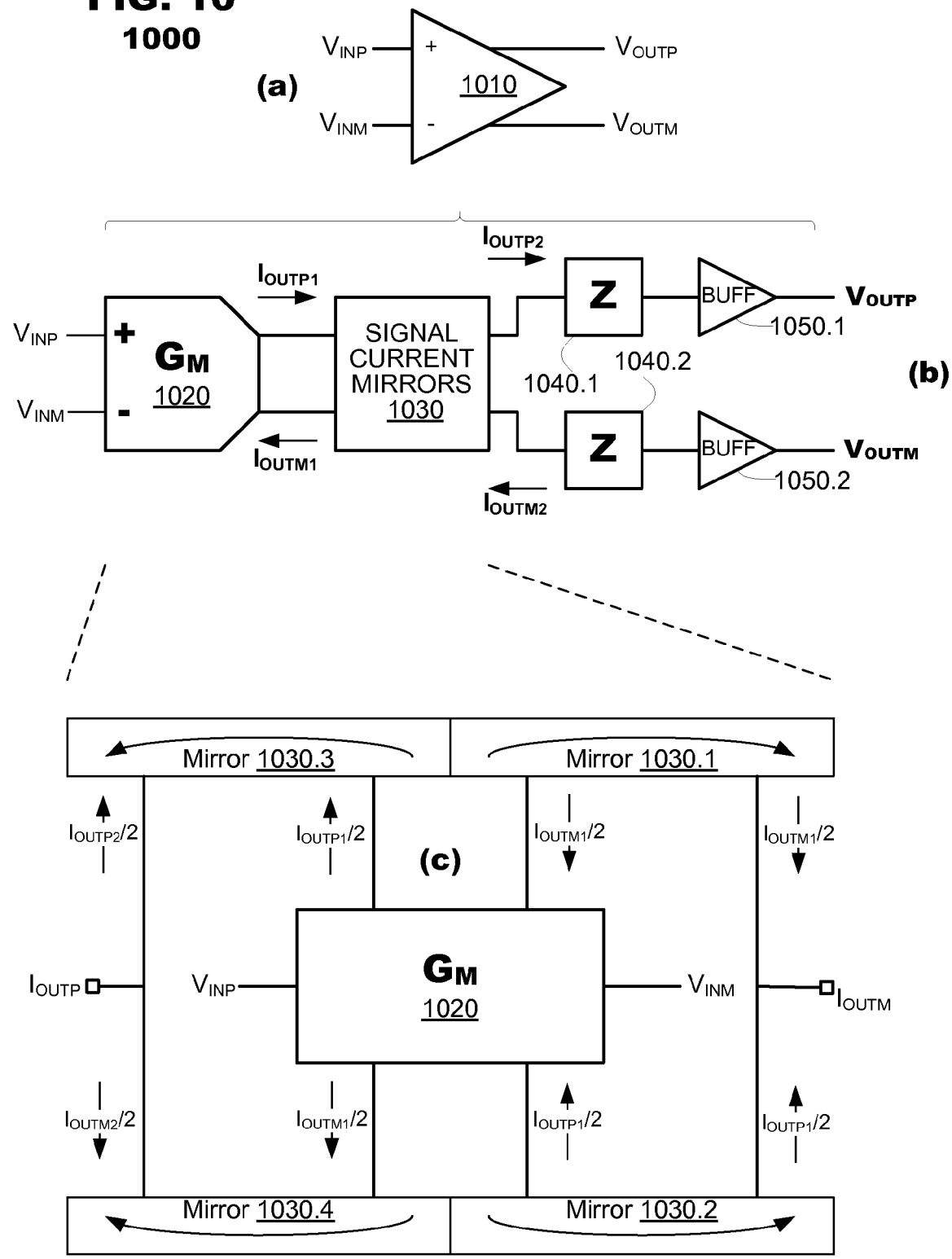
FIG. 10 is a diagram of a differential amplifier for use with embodiments of the present invention.

FIG. 10 is a diagram of a fully differential amplifier for use with embodiments of the present invention. FIG. 10A illustrates a fully differential op-amp 1010 symbolically. The op-amp 1010 may generate a pair of output voltages $V_{OUTP}$, $V_{OUTM}$ based on a difference between a pair of input voltages $V_{INP}, V_{INM}$ (e.g., $(V_{OUTP}-V_{OUTM})=A*(V_{INP}-V_{INM})$, where 'A' may be the open loop gain of the op-amp 1010).

FIG. 10B provides a block diagram for the fully differential op-amp 1010. As illustrated, a $G_M$ circuit 1020 may generate differential output currents $I_{OUTP1}, I_{OUTM1}$ in response to input voltages $V_{INP}, V_{INM}$ (e.g., $(I_{OUTP1}-I_{OUTM1})=G_M*(V_{INP}-V_{INM})$. Signal current mirrors 1030 may generate output currents $I_{OUTP2}, I_{OUTM2}$ corresponding to the currents $I_{OUTP1}, I_{OUTM1}$ received from the $G_M$ circuit 1020. The output currents $I_{OUTP2}, I_{OUTM2}$ may pass through impedance blocks 1040.1, 1040.2, which may create corresponding output voltages having magnitude $G_M*Z*(V_{INP}-V_{INM})$. Amplifier buffers 1050.1, 1050.2 may generate output voltages $V_{OUTP}=-V_{OUTM}$ (e.g., $(V_{OUTP}-V_{OUTM})=G_M*Z*(V_{INP}-V_{INM})$).

FIG. 10C illustrates application of the $G_M$ circuit 1020 as an input stage for the op-amp 1010. As illustrated, the $G_M$ circuit 1020 may generate complementary pairs of output currents $I_{OUTP1}/2$ and $I_{OUTM1}/2$, each representing half of the overall current for $I_{OUTP1}, I_{OUTM1}$. The signal current mirrors 1030 may be represented as complementary sets of mirrors 1030.1-1030.4, each receiving a respective input current signal and generating corresponding mirrored output currents. A first pair of output currents $I_{OUTP2}/2, I_{OUTM2}/2$ may be summed at an output node to generate the output current $I_{OUTP}$ and a second pair of output currents $I_{OUTM2}/2, I_{OUTP2}/2$ may be summed at an output node to generate the output current $I_{OUTM}$.

Several embodiments of the present invention are specifically illustrated and described herein. However, it will be appreciated that modifications and variations of the present invention are covered by the above teachings. In other instances, well-known operations, components and circuits have not been described in detail so as not to obscure the embodiments. It can be appreciated that the specific structural and functional details disclosed herein may be representative and do not necessarily limit the scope of the embodiments.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

I claim:

1. A transconductance circuit, comprising:
a complementary set of differential transistor pairs, a first transistor pair having emitters commonly coupled to a first common node and respective collectors coupled to a first pair of output terminals for the transconductance circuit, a second transistor pair having emitters commonly coupled to a second common node, and respective collectors coupled to a second pair of output terminals for the transconductance circuit;
each pair having a first transistor to receive a first input voltage at its corresponding base, and a second transistor to receive a second input voltage at its corresponding base;
an impedance coupled between the first and second common nodes;
complementary sets of doublet differential transistor pairs, each doublet circuit comprising a complementary set of doublet differential transistor pairs, a first transistor of each pair to receive the first input voltage at its base, a second transistor of each pair to receive the second input voltage at its base;
a first differential transistor pair of each set wherein the first and second transistors having emitters coupled to a corresponding current source, the first and second transistors having collectors coupled respectively to the first pair of output terminals;
a second differential transistor pair of each set wherein the first and second transistor having emitters coupled to a corresponding current source, the first and second transistors having collectors coupled respectively to the second pair of output terminals; and
the first and second transistor of each doublet differential pair having area offsets opposed to each other.

2. The transconductance circuit of claim 1, further comprising:
a first voltage follower to receive the first input voltage at a first input terminal and replicate the first input voltages across the bases of the first transistors for each pair; and
a second voltage follower to receive the second input voltage at a second input terminal and replicate the second input voltage across the bases of the second transistors for each pair.

3. The transconductance circuit of claim 2, wherein the circuit is configured to generate output currents from each output terminal that track changes for the first and second input voltages across a predetermined voltage range.

4. The transconductance circuit of claim 2, wherein the circuit is configured to provide an approximately linear transconductance for the first and second input voltages across a predetermined voltage range.

5. A method for generating a pair of output currents from a transconductance circuit which track voltage changes for a predetermined range of input voltages, comprising:
applying one of a pair of input voltages to first transistor bases of a set of complementary differential transistor pairs and sets of complementary doublet differential transistor pairs;
applying the other of the pair of input voltages to second transistor bases of the set of complementary differential transistor pairs and the sets of complementary doublet differential transistor pairs;
generating the pair of output currents from a first and second pair of outputs of the transconductance circuit, wherein each output represents one-half of one of the pair of output currents.

6. The method of claim 5, further comprising configuring the complementary sets of doublet differential transistor pairs with opposing area offsets to generate an approximately linear transconductance across the predetermined range of input voltages.

7. The method of claim 5, further comprising configuring a common impedance for the complementary sets of differential transistor pairs to generate the pair of output currents.

* * * * *